(12) United States Patent
Yoshida

(10) Patent No.: US 10,053,796 B2
(45) Date of Patent: Aug. 21, 2018

(54) METHOD FOR MANUFACTURING GROUP III NITRIDE SUBSTRATE FORMED OF A GROUP III NITRIDE CRYSTAL

(71) Applicant: SUMITOMO CHEMICAL COMPANY, LIMITED, Tokyo (JP)

(72) Inventor: Takehiro Yoshida, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/313,764

(22) PCT Filed: May 22, 2015

(86) PCT No.: PCT/JP2015/064771
§ 371 (c)(1),
(2) Date: Nov. 23, 2016

(87) PCT Pub. No.: WO2015/182520
PCT Pub. Date: Dec. 3, 2015

(65) Prior Publication Data
US 2017/0247813 A1 Aug. 31, 2017

(30) Foreign Application Priority Data
May 26, 2014 (JP) .................................. 2014-108255

(51) Int. Cl.
C30B 25/18 (2006.01)
B28D 5/00 (2006.01)
(Continued)

(52) U.S. Cl.
CPC .......... *C30B 25/186* (2013.01); *B23K 26/364* (2015.10); *B23K 26/402* (2013.01);
(Continued)

(58) Field of Classification Search
CPC .......... C30B 25/00; C30B 25/02; C30B 25/18; C30B 25/186; C30B 25/20; C30B 29/00;
(Continued)

(56) References Cited

U.S. PATENT DOCUMENTS

2004/0187766 A1* 9/2004 Letertre ................. C30B 25/02
117/11
2006/0046325 A1 3/2006 Usui et al.
(Continued)

FOREIGN PATENT DOCUMENTS

JP 9-67199 A 3/1997
JP 11-268989 A 10/1999
(Continued)

OTHER PUBLICATIONS

Victor David publication entitled "Slice and dice: laser micromachining for consumer electronics," Industrial Laser Solutions for Manufacturing, vol. 250, Issue 4, published Jul. 1, 2010.*
(Continued)

Primary Examiner — Kenneth A Bratland, Jr.
(74) Attorney, Agent, or Firm — Birch, Stewart, Kolasch & Birch, LLP

(57) ABSTRACT

There is provided a method for manufacturing a group III nitride substrate, including: preparing a plurality of seed crystal substrates formed into shapes that can be arranged with side surfaces opposed to each other; bonding the plurality of seed crystal substrates on a base material by an adhesive agent in an appearance that the seed crystal substrates are arranged with the side surfaces opposed to each other; growing a group III nitride crystals above main surfaces of the plurality of seed crystal substrates, so that crystals grown on each main surface are integrally combined each other; and obtaining a group III nitride substrate formed of the group III nitride crystal.

15 Claims, 5 Drawing Sheets

(51) Int. Cl.
  *B23K 26/364* (2014.01)
  *B23K 26/402* (2014.01)
  *C30B 25/20* (2006.01)
  *C30B 29/40* (2006.01)
  *B23K 103/00* (2006.01)

(52) U.S. Cl.
  CPC ............ *B28D 5/0011* (2013.01); *C30B 25/20* (2013.01); *C30B 29/406* (2013.01); *B23K 2203/56* (2015.10)

(58) Field of Classification Search
  CPC ....... C30B 29/10; C30B 29/40; C30B 29/403; C30B 29/406; C30B 33/00; C30B 33/02; C30B 33/06; C30B 33/08; C30B 33/10; B23K 26/364; B23K 26/402; B23K 2203/56; B28D 5/0011
  USPC ......... 117/84, 88–90, 94, 97, 101, 106, 923, 117/937, 952
  See application file for complete search history.

(56) References Cited

U.S. PATENT DOCUMENTS

| | | | |
|---|---|---|---|
| 2009/0236694 | A1 | 9/2009 | Mizuhara et al. |
| 2012/0000415 | A1* | 1/2012 | D'Evelyn ............... C30B 25/02 117/94 |
| 2012/0112320 | A1* | 5/2012 | Kubo ................... C23C 16/303 257/615 |

FOREIGN PATENT DOCUMENTS

| | | | |
|---|---|---|---|
| JP | 4117156 | B2 | 4/2008 |
| JP | 2008-133151 | A | 6/2008 |
| JP | 2008-280196 | A | 11/2008 |
| JP | 2011-63504 | A | 3/2011 |
| JP | 2012-1432 | A | 1/2012 |
| JP | 2012-31028 | A | 2/2012 |
| JP | 2012-41206 | A | 3/2012 |
| JP | 2012-56799 | A | 3/2012 |
| JP | 4915128 | B2 | 4/2012 |
| JP | 2012-197190 | A | 10/2012 |
| JP | 2013-230971 | A | 11/2013 |
| JP | 5332168 | B2 | 11/2013 |
| JP | 2014-47097 | A | 3/2014 |

OTHER PUBLICATIONS

International Search Report for PCT/JP2015/064771 dated Aug. 4, 2015.
Written Opinion of the International Searching Authority for PCT/JP2015/064771 dated Aug. 4, 2015.
The International Preliminary Report on Patentability and English translation of the Written Opinion of the International Searching Authority (PCT/IB/373, PCT/IB/338, PCT/ISA/237), dated Dec. 8, 2016, for Application No. PCT/JP2015/064771 are provided.
Horikiri, "Reducing Initial Failures in GaN-on-GaN Vertical Diodes," Compound Semiconductor, Nov./Dec. 2016, pp. 48-52.
Imanishi et al., "Na-flux Growth on the Tiling HVPE Wafer for the Suppression of V-shape Valley Formation at the Coalescence Boundary," IWN, Oct. 5, 2016, 2 pages.
Imanishi et al., "Suppression of V-Shape Valley Formation at the Coalescence Boundary in 4-Inch GaN Crystals Grown from Multiple HVPE Wafers by the Na-Flux Growth," ICCGE-18, Aug. 11, 2016, 1 page.
Japanese Office Action and English translation thereof, dated Mar. 7, 2017, for Japanese Application No. 2016-182170.
Japanese Office Action and English translation thereof, dated Nov. 8, 2016, for Japanese Application No. 2016-182170.
Kitamura et al., "Study of Manufacturing Process for Free-standing GaN Substrates Grown by HVPE Method with Hybrid Tiling Technique," IWN, Oct. 3, 2016, 2 pages.
Yoshida et al., "Development of GaN Substrate with Large Diameter and Low Orientation Deviation," ICCGE-18, Aug. 7-12, 2016, 1 page.
Yoshida et al., "Development of GaN Substrate with Large Diameter and Low Orientation Deviation," IWN, Oct. 3, 2016, 2 pages.
English translation of the Japanese Notification of Reasons for Refusal, dated Nov. 8, 2016, for Japanese Application No. 2014-108255.
English translation of the Japanese Notification of Reasons for Refusal, dated Feb. 28, 2017, for Japanese Application No. 2014-108255.
English translation of the Japanese Notification of Reasons for Refusal, dated Nov. 8, 2016, for Japanese Application No. 2016-182169.
English translation of the Japanese Notification of Reasons for Refusal, dated Feb. 28, 2017, for Japanese Application No. 2016-182169.
English translation of the Japanese Decision of Refusal, dated Jun. 20, 2017, for Japanese Application No. 2016-182169.
English translation of the Japanese Decision to Decline the Amendment, dated Jun. 20, 2017, for Japanese Application No. 2016-182169.

* cited by examiner (A)

(B)

(A)

(B)

(A)

(B)

METHOD FOR MANUFACTURING GROUP III NITRIDE SUBSTRATE FORMED OF A GROUP III NITRIDE CRYSTAL

TECHNICAL FIELD

The present invention relates to a method for manufacturing a group III nitride substrate.

DESCRIPTION OF RELATED ART

A group III nitride semiconductor material has a large forbidden band width, and is a direct transition type, and therefore is suitable, for example, for a light emitting element of a short wavelength. In recent years, the group III nitride semiconductor material is used for a blue-violet laser diode or green, blue, or white light-emitting diode, etc.

When group III nitride semiconductor devices are manufactured, since there is no suitable substrate material with a small lattice mismatch, and therefore a sapphire substrate has been used conventionally. However, about $10^8$ to $10^{10}$ dislocation defects per 1 $cm^2$ are introduced to the group III nitride semiconductor device made on the sapphire substrate, due to such a not small lattice mismatch. In addition, the sapphire substrate has considerably poor electrical conductivity and thermal conductivity, thus causing a low performance of the group III nitride device on the sapphire substrate.

However, in recent years, a high quality single crystal gallium nitride substrate having a dislocation density of about $10^5$ to $10^6$ per 1 $cm^2$, has been realized and has been widely in circulation. Owing to a homo-growth on the substrate with excellent electrical conductivity and thermal conductivity, a device capable of exhibiting a high performance can be easily obtained.

Single crystal gallium nitride substrates which are currently in circulation are mostly manufactured by being grown on a foreign substrate by halide vapor phase epitaxy (HVPE), and free-standing therefrom by some method (for example see patent document 1).

Under such a circumstance of a manufacturing method, the single crystal gallium nitride substrate is easily cracked during manufacture or it is difficult to make a larger diameter thereof. When the substrate is cracked during manufacture, the following backing technique is known: cracked parts are arranged side by side so that an opposite surface of a main surface is exposed, which are then joined to each other again by a growth of a group III nitride polycrystal, to thereby improve a yield (patent document 2)

Further, the following method is also known: a plurality of seed crystals are arranged side by side, with the main surface exposed, and a crystal growth is caused thereon, so that the adjacent parts are combined each other, to thereby make a large diameter (patent documents 3 to 6).

PRIOR ART DOCUMENT

Patent Document

Patent document 1: Patent Publication No. 4117156
Patent document 2: Japanese Patent Laid Open Publication No. 2012-56799
Patent document 3: Patent Publication No. 4915128
Patent document 4: Patent Publication No. 5332168
Patent document 5: Japanese Patent Laid Open Publication No. 2011-63504
Patent document 6: Japanese Patent Laid Open Publication No. 2012-31028

SUMMARY OF THE INVENTION

Problem to be Solved by the Invention

However, according to an examination by inventors of the present invention, the following problem is generated by the methods described in patent documents 3 to 6. According to the methods described in patent documents 3 to 5, a plurality of seed crystal plates are simply arranged, thus easily causing a deviation of the plurality of seed crystal plates, and the growth of a high quality crystal is difficult. According to the method described in patent document 6, in order to prevent the deviation of a plurality of seed crystal plates, the seed crystal plates are fixed by an aluminum oxide jig. However, even if such a fixing method is used, a high quality crystal growth is difficult.

An object of the present invention is to provide a new technique of manufacturing the group III nitride substrate that causes crystal growth on the seed crystal substrate which is formed by arranging a plurality of seed crystal substrates side by side.

Means for Solving the Problem

According to an aspect of the present invention, there is provided a method for manufacturing a group III nitride substrate, including:

preparing a plurality of seed crystal substrates formed into shapes that can be arranged with side surfaces opposed to each other;

bonding the plurality of seed crystal substrates on a base material by an adhesive agent, in an appearance that the seed crystal substrates are arranged with the side surfaces opposed to each other;

growing a group III nitride crystals above main surfaces of the plurality of seed crystal substrates, so that crystals grown on each main surface are integrally combined each other; and obtaining a group III nitride substrate formed of the group III nitride crystal.

Advantage of the Invention

A high quality group III nitride substrate can be easily obtained by arranging the seed crystal substrates by fixing positions on the base material using the adhesive agent, and causing the crystal growth thereon.

DETAILED DESCRIPTION OF THE INVENTION

A manufacturing method of a group III nitride substrate according to an embodiment of the present invention, will be described hereafter. For example, those represented by the general formula $Al_xIn_yGa_{1-x-y}N$ ($0 \leq x \leq 1, 0 \leq y \leq 1, 0 \leq x+y \leq 1$) are given as the group III nitride.

Here, as an example, explanation will be given for a method of manufacturing a group III nitride substrate of a large diameter having a dimeter of 100 mm, by causing a crystal growth on a seed crystal substrate which is formed by assembling a plurality of seed crystal substrates which are cut out from four group III crystal substrates having a diameter of 75 mm. The large diameter refers to 100 mm or more or 4 inches of more, for example.

The group III nitride substrate from which a seed crystal is cut out, is also called a material substrate in some cases. The seed crystal substrate formed by combining (assembling) a plurality of seed crystal substrates, is called a seed crystal substrate assembly in some cases. The group III nitride substrate manufactured by the crystal growth on the seed crystal substrate assembly, is called a combined substrate in some cases.

First, four commercially available (0001) substrates or (000-1) substrates having a diameter of 75 mm, are prepared as group III nitride single crystal substrates which are the material substrates. The seed crystal substrates having shapes that will be a disc shape with a diameter of 110 mm when being assembled, are cut out from the above material substrates.

Figure 1:
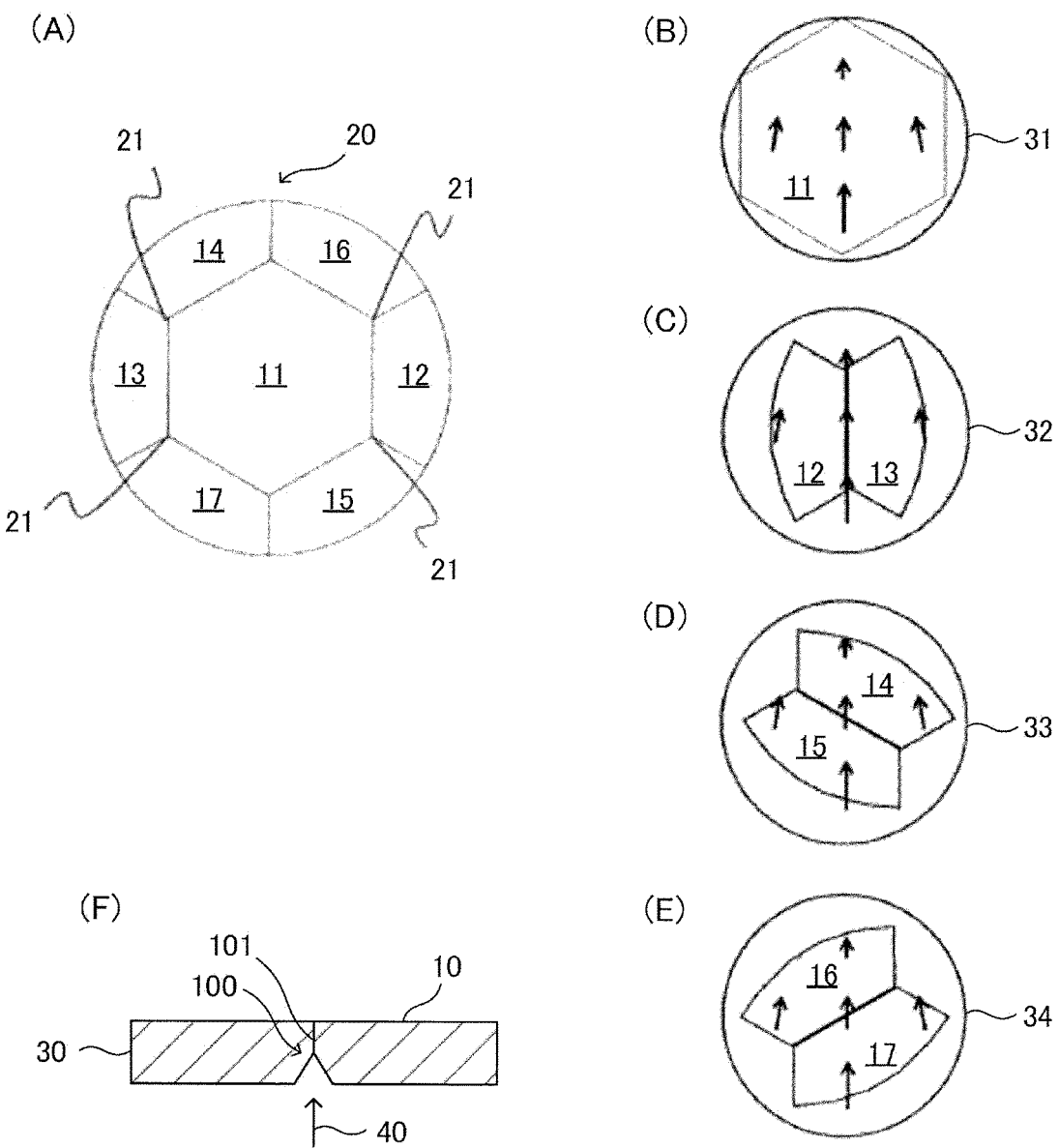
FIG. 1(A) is a layout view showing a layout of seed crystal substrates in a seed crystal substrate assembly according to an embodiment of the present invention, and FIG. 1 (B) to FIG. 1(E) are schematic plan views showing material substrates and a cutting layout pattern of the seed crystal substrates according to an embodiment.
FIG. 1(F) is a schematic cross-sectional view showing a cutting step of the seed crystal substrate according to an embodiment.
Figure 2:
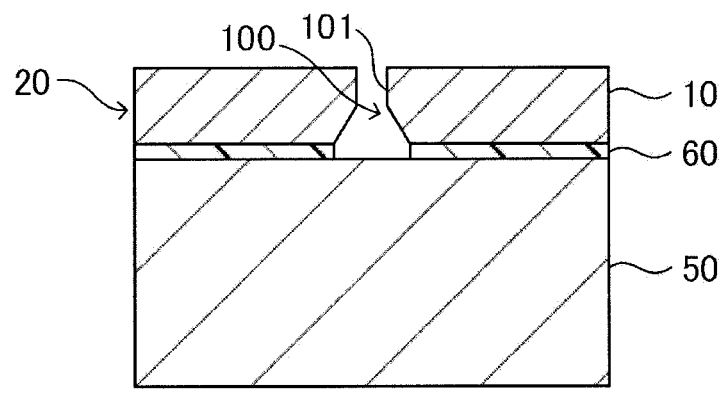
FIG. 2(A) and FIG. 2(B) are schematic cross-sectional views showing manufacturing steps of the combined substrate according to an embodiment.
Figure 2:
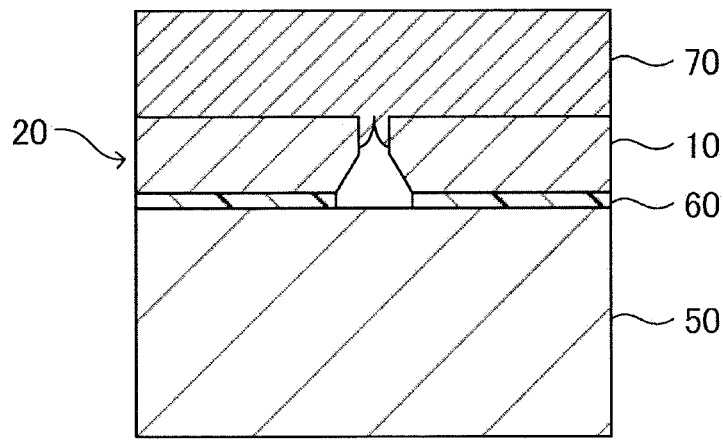
Figure 3:
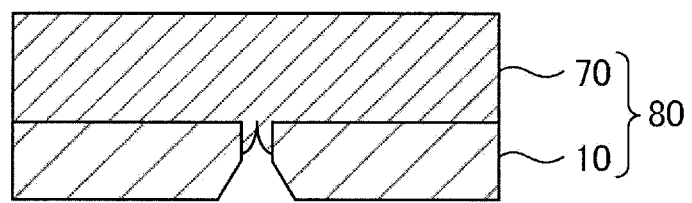
FIG. 3(A) and FIG. 3(B) are schematic cross-sectional views showing manufacturing steps of the combined substrate according to an embodiment.
Figure 3:
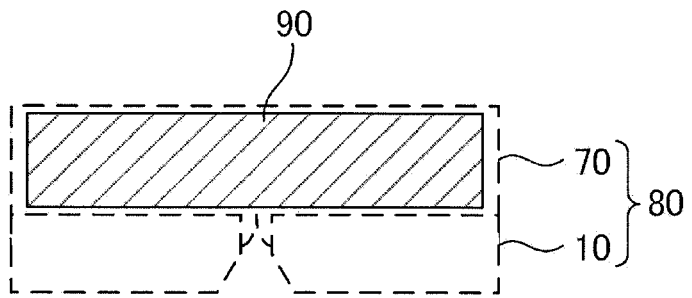

FIG. 1(A) is a layout view showing layout examples of seven seed crystal substrates 11 to 17 assembled into a disc shape, and a seed crystal substrate assembly 20 is formed by the seed crystal substrates 11 to 17. FIG. 1(B) to FIG. 1(E) are schematic plan views showing four material substrates 31 to 34 respectively, wherein cut-out patterns (drawing patterns by a laser scribing described later) of the seed crystal substrates 11 to 17 corresponding to the layout view of FIG. 1(A), are shown in the material substrates 31 to 34. Each one of the seed crystal substrates 11 to 17 is sometimes called a seed crystal substrate 10 without distinguishing each other, and each one of the material substrates 31 to 34 is sometimes called a material substrate 30 without distinguishing each other.

FIG. 1(A) is a view of the seed crystal substrate assembly 20 viewed from a main surface side (front side), and FIG. 1(B) to FIG. 1(E) are views of the material substrates 31 to 34 viewed from an opposite side (back side) of the main surface. Accordingly, each shape of the seed crystal substrates 11 to 17 is displayed in an appearance of being inverted, in FIG. 1(A) and FIG. 1(B) to FIG. 1(E).

Each one of the seed crystal substrates 11 to 17 is the shape surrounded by sides which are all perpendicular to <10-10> direction, except for an arc portion that defines an outer periphery of the seed crystal substrate assembly 20. Namely, all side surfaces by which the seed crystal substrates 10 are faced each other, are the side surfaces with {10-10} planes exposed.

This example shows a layout in which a hexagonal seed crystal substrate 11 which is defined by six sides perpendicular to <10-10> direction, is arranged in a central part of the seed crystal substrate assembly 20, and seed crystal substrates 12 to 17 are adjacent to each of the six sides of the seed crystal substrate 11. The central seed crystal substrate 11 is defined in the material substrate 31, in accordance with the above layout. Further, an assembly of the seed crystal substrates 12 and 13 is defined in the material substrate 32, and an assembly of the seed crystal substrates 14 and 15 is defined in the material substrate 33, and an assembly of the seed crystal substrates 16 and 17 is defined in the material substrate 34, with the seed crystal substrates adjacent to each of a pair of mutually opposed sides of the seed crystal substrate 11 as one assembly.

Arrows shown in FIG. 1(B) to FIG. 1(E) indicate directions of inclinations of main surface orientations, wherein each length of them shows a degree of each inclination of the main surface orientations. This is an image of a so-called off-angle distribution.

In the seed crystal substrate assembly 20, the cut-out of the material is preferably performed so as to align the directions of the inclinations of the off-angle of each seed crystal substrate 11 to 17 in one direction. For example, angles formed by the directions of the inclinations of the off-angle, are preferably set to 10° or less at maximum in the plane of the seed crystal substrate assembly 20. Further, a difference between a maximum value and a minimum value of the off-angle in a single body of each seed crystal substrate 11-17, is preferably set to 0.5° or less at largest.

For example, the seed crystal substrates 11 to 17 are cut out from the material substrates 31 to 34 in accordance with the abovementioned drawing pattern, by a laser scribing apparatus for example. At this time, as described hereafter, it is most preferable that laser irradiation (drawing) is performed from the back surface side of the material substrates 31 to 34 (opposite side to the main surface of the seed crystal substrate assembly 20), to thereby separate the seed crystal substrates by cleavage.

A cut surface formed by the laser irradiation at the time of laser scribing, is likely to be a tapered shape, and is not vertical to the main surface. Specifically, a laser incident side opening is likely to be wide. Accordingly, there is an effect of not uselessly widening the main surface side opening by drawing from back.

Further, an amorphous affected layer which is recrystallized after being melt once, is present on the cut surface formed by the laser irradiation. Accordingly, regarding the cut of the edge portion other than an arc portion, it is most preferable to leave a part uncut by a thickness of 5% to 50% of the thickness of the material substrate, thereby forming a scribe groove, and finally separate the seed crystal substrate with a cleavage plane ({10-10} plane here) which is a natural end surface. The side portion other than the arc portion may also be fully cut by the laser radiation in a thickness direction of the substrate.

FIG. 1(F) is a schematic cross-sectional view showing the cutting-out step of the seed crystal substrate 10 from the material substrate 30, by irradiation of the laser beam 40 from the back surface side, and cleavage. In the formed side surface 100, the cleavage plane ({10-10} plane) 101 is arranged on the main surface side of the formed side surface 100, and in this state, the seed crystal substrate 10 is cut out.

When the laser scribing is applied thereto, powder of the group III nitride is generated in large quantities, which are attached to the seed crystal substrate 10, and if such a state is left as it is, the crystal growth described later is adversely affected thereby. Therefore, washing for removing the powder is performed. As a washing method, for example, bubbling washing is suitable, using a chemical solution of one-to-one mixture of hydrochloric acid and hydrogen peroxide.

As described above, the seed crystal substrates 11 to 17 formed into shapes in which the side surfaces can be arranged in an appearance of being faced each other, are prepared.

A method for manufacturing the combined substrate will be described next. FIG. 2(A) to FIG. 3(B) are schematic cross-sectional views showing the manufacturing steps of the combined substrate according to this embodiment.

FIG. 2(A) is referenced. The seed crystal substrates 11 to 17 (a plurality of seed crystal substrates 10) are arranged on a base material 50 in accordance with the layout of FIG. 1(A). Namely, the seed crystal substrates 10 are arranged so that the side surfaces 100 with {10-10} plane 101 exposed, are opposed in close proximity to each other, with no gap formed between them as much as possible. At this time, the seed crystal substrates 10 are arranged so that positions on the base material 50 are fixed by applying an adhesive agent 60 on the back surfaces of the seed crystal substrates 10 (a plurality of seed crystal substrates 10 are bonded on the base material 50 by the adhesive agent 60, in the arrangement in which the side surfaces 100 are opposed to each other). Thus, the seed crystal substrate assembly 20 is formed on the base material 50. A plurality of seed crystal substrates 10 are arranged, with plan orientations of the main surfaces coordinated each other. Namely, the main surface of the seed crystal substrate assembly 20 is set as (0001) plane or (000-1) plane as a whole.

In the crystal growth described later, it is preferable that the seed crystal substrates 10 are arranged, with the side surfaces 100 in close proximity to each other, so that crystals which are grown upward on each main surface of the seed crystal substrate 10 are integrally combined in in-plane direction. For example, the gap between opposing sides of the arranged seed crystal substrates 10, is preferably 100 µm or less, and more preferably 50 µm or less even at a widest place. The reason is as follows. If the gap is too wide, there is possibly a failure in combining crystals, or through holes are likely to be generated in the crystal growth described later.

As the material of the base material 50, it is suitable to use the material having a linear expansion coefficient equivalent to or smaller than the linear expansion coefficient of the group III nitride constituting the seed crystal substrate 10 and the crystal grown on its main surface. By thus selecting the linear expansion coefficient of the base material 50, it is possible to suppress widening of the gap between the seed crystal substrates 10, which is caused by a temperature rise in the crystal growth described later. Here, since the main surface is formed as (0001) plane or (000-1) plane, the linear expansion coefficient to be considered is the linear expansion coefficient in in-plane direction, namely, <11-20> direction (a-axis direction) parallel to the main surface.

For example, in a case of GaN, the linear expansion coefficient in <11-20> direction is $5.59 \times 10^{-6}$/K, and for example in a case of AlN, the linear expansion coefficient in <11-20> direction is $4.15 \times 10^{-6}$/K.

As the base material having the linear expansion coefficient equivalent to or smaller than the abovementioned values, and easily available at a low cost, and exhibiting a certain degree of rigidity, for example, isotropic graphite, pyrolytic graphite, silicon, quartz, and the like, can be given.

As the adhesive agent 60, it is preferable to use the adhesive agent that withstands a growth temperature and a growth atmosphere at the time of the crystal growth described later, and having the linear expansion coefficient close to that of the group III nitride. Specifically, the adhesive agent mainly composed of zirconia or silica is suitable, and for example, commercially available Aron Ceramic C agent or E agent (produced by Toagosei Co., Ltd.) can be given.

FIG. 2(B) is referenced. When the adhesive agent 60 is solidified, the seed crystal substrate assembly 20 formed on the base material 50, is introduced to a crystal growth apparatus, specifically into a hydride vapor phase epitaxy (HVPE) apparatus.

A substrate temperature is raised to a temperature within a range of 950° C. to 1100° C., and more preferably within a range of 1050° C. to 1100° C., while supplying NH$_3$ gas for the purpose of preventing the decomposition of the seed crystal substrate 10. When the substrate temperature reaches a target temperature, supply of the group III source gas is started, to thereby make the group III nitride crystal grow by 1 mm for example, in a thickness direction. Then, crystals grown from the main surface of each seed crystal substrate 10, are completely combined each other in the in-plane direction, and a group III nitride single crystal layer 70 having a large diameter can be obtained.

FIG. 3(A) is referenced. Next, a group III nitride crystal portion 80 (a laminated portion of the seed crystal substrates 10 and the grown single crystal layer 70) is separated from the base material 50 (to obtain a freestanding group III nitride crystal portion 80). For example, when pyrolytic graphite is used as the base material 50, an outermost surface layer of the base material becomes a sacrificial layer, to thereby facilitate the freestanding from the base material 50. In the case of using the base material 50 made of other material, the group III nitride crystal portion 80 is made to be freestanding from the base material 50 using a suitable slicer. The adhesive agent 60 fixed to a back surface of the freestanding crystal portion 80, is removed by washing with HF aqueous solution, etc.

FIG. 3(B) is referenced. Next, periphery processing and front and back polishing are applied to the freestanding group III nitride crystal portion 80. It is preferable to completely remove particularly the seed crystal substrates 10 which are the seed crystal portion. Thus, a group III nitride combined substrate 90 having a large diameter of 100 mm can be obtained.

Owing to the abovementioned manufacturing method of the group III nitride substrate, for example the following effects can be obtained.

Here, the following case is considered as a first comparative embodiment. The crystal growth is caused on the seed crystal substrate assembly in which the seed crystal substrates are simply placed side by side on the base material without using the adhesive agent. In the first comparative embodiment, even if the seed crystal substrate assembly is formed by arranging the seed crystal substrates on the base material with an utmost care and attention, each seed crystal substrate is moved due to an impact generated when introducing the seed crystal substrate assembly to the crystal growth apparatus, or a vibration generated when rotating the seed crystal substrate assembly in the in-plan direction to improve uniformity of the growth in the crystal growth apparatus, or a force generated by a gas flow such as a source gas, etc., and it is extremely difficult to cause the crystal growth in a state in which the seed crystal substrates are suitably closely opposed to each other.

As a result, a combination of the crystals grown on each seed crystal substrate is incomplete, or a strength as the combined substrate is incomplete, or a through hole penetrating from the main surface side to the back surface side is formed, or the combination of the crystals does not occur from the first. Further, when a parallelism between the opposing sides is worse, an extremely high density defect is generated in a combined assembly region, thus causing cracks or through holes, and in order to alleviate stresses caused thereby, main surfaces of all seed crystal substrates cannot be present on the same plane.

Namely, in the first comparative embodiment, the property and the shape of the formed crystal are likely to be different every time, due to the deviation of each seed crystal substrate, and a large diameter substrate cannot be obtained in some cases. Even if luckily the large diameter substrate can be obtained, the through holes or extremely high density defect concentration regions are generated. There is also a problem that polishing is difficult or an off-angle variation after polishing is not necessarily small.

Further, as a second comparative embodiment, the following case is considered. The seed crystal substrates are arranged on the base material without using the adhesive agent, and the crystal growth is caused on the seed crystal substrate assembly which is fixed from an outer periphery by a jig. In order to fix the plurality of seed crystal substrates without allowing them to be collapsed, an overall pressure is applied thereto in an arrangement direction of the seed crystal substrates arranged side by side, at least at a room temperature. Then, the following problems occur. At the crystal growth temperature, the pressure is increased under an influence of a thermal expansion, thus causing a collapse of the arrangement of the seed crystal substrates, and not allowing the main surfaces to be present on the same plane, or generating chipping or cracks on some of the seed crystal substrates, and allowing particles generated at this time to be placed on the main surfaces, resulting in an extremely adverse influence on the growth into combined state on the seed crystals and a quality of the substrate obtained as a result.

On the other hand, in this embodiment, the seed crystal substrate assembly is formed by attaching the seed crystal substrates on the base material by the adhesive agent, to thereby fix the positions of the seed crystal substrates.

Thus, the arrangement of the seed crystal substrates is not deviated even if carrying out the step of introducing the seed crystal substrate assembly into the growth apparatus, or the step of raising the temperature from the room temperature to the growth temperature, or the step of rotating the seed crystal substrate assembly in the growth apparatus. Further, an excessive pressure is prevented from adding between the seed crystal substrates, to thereby facilitate the crystal growth in a state in which the seed crystal substrates are suitably closely opposed to each other. As a result, manufacture of a high quality group III nitride substrate without holes penetrating from the main surface to an opposite surface thereof, with a difference between a maximum value and a minimum value of the off-angle set within 0.5° over the whole surface of the main surface, and having a large diameter of 100 mm or more for example, can be facilitated with good yield.

As a third comparative embodiment, the following case is considered. The opposed side surfaces of the seed crystal substrates are constituted including the plane other than {10-10} plane. In the third comparative embodiment, the combination of the crystals grown on the seed crystal substrates is likely to be incomplete at a place where corner portions of the seed crystal substrates are close to each other (a position similar to position 21 shown in FIG. 1(A) in this embodiment), and the hole penetrating from front to back is likely to be remained.

In contrast, in this embodiment, the shapes of the seed crystal substrates are defined so that the seed crystal substrates are opposed to each other only by the side surfaces with {10-10} plane exposed. Thus, it is possible to suppress a failure in forming the through hole, etc., at a place (position 21 shown in FIG. 1(A)) where the corner portions of the seed crystal substrates are close to each other.

Figure 4:
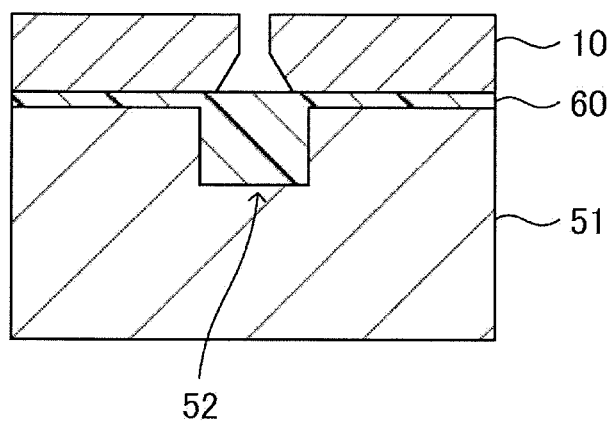
FIG. 4(A) and FIG. 4(B) are schematic cross-sectional views showing manufacturing steps of the combined substrate according to a first modified example and a second modified example.
Figure 4:
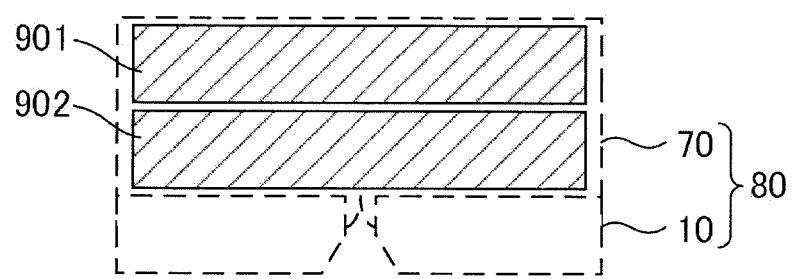

Next, explanation will be given for the manufacturing method of the group III nitride substrate according to a first modified example of the abovementioned embodiment. FIG. 4(A) is a schematic cross-sectional view showing the manufacturing step of the combined substrate according to this modified example. Mainly a difference from the abovementioned embodiment will be described hereafter.

FIG. 4(A) shows the step of arranging a plurality of seed crystal substrates 10 on the base material 51, corresponding to the step described in the abovementioned embodiment with reference to FIG. 2(A). When the seed crystal substrates 10 are arranged by applying the adhesive agent 60 to the back surfaces, there is a possibility that an excess adhesive agent 60 is protruded to the main surface side from a gap between the seed crystal substrates 10 if an excessive amount of the adhesive agent 60 is applied.

A groove 52 is formed on the base material 51 of this modified example along an edge portion where the seed crystal substrates 10 are adjacent to each other, for allowing the excess adhesive agent 60 to flow thereinto. In this modified example, it is possible to suppress protruding of the adhesive agent 60 from the gap between the adjacent seed crystal substrates 10, by using the base material 51 having such a groove 52. It should be noted that if a recess portion is formed at least between the adjacent seed crystal substrates 10 so that the excess adhesive agent 60 can be flow thereinto, even if it is not the continuous groove shape, a similar effect can be generated. The other step in this modified example, is similar to the abovementioned embodiment, and in this modified example as well, the same effect of facilitating the formation of the high quality substrate assembly, can be obtained.

Next, explanation will be given for the method for manufacturing the group III nitride substrate according to a second modified example of the abovementioned embodiment. FIG. 4(B) is a schematic cross-sectional view showing the manufacturing step of the substrate assembly according to this modified example. Mainly the difference from the abovementioned embodiment will be described hereafter.

In the abovementioned embodiment, explanation is given for an example (see FIG. 3(B)) of obtaining one combined substrate 90 from the grown group III nitride single crystal layer 70. However, as described in this modified example shown in FIG. 4(B), it is also possible to obtain a plurality of combined substrates 901 and 902, etc., by slicing a thickly grown group III nitride single crystal layer 70 (for example, having a thickness of about 10 mm).

Further, the following other embodiment can also be given. In the abovementioned embodiment, explanation is given for an example of forming the shape of the corner portion of the seed crystal substrate into a corner of a hexagonal shape surrounded by {10-10} planes. However, the shape of the seed crystal substrate is not limited thereto, and the shape of the corner portion may be a corner of an equilateral triangle shape surrounded by {10-10} planes. Even if the shapes of the seed crystal substrates are formed in this manner, the effect of suppressing the formation of the through hole, etc., at the place where the corner portions of the seed crystal substrates are close to each other, can be obtained.

Further, in the abovementioned embodiment, explanation is given for a case of manufacturing the combined substrate having a large diameter, for example having a diameter of 100 mm or more (or having a diameter of 4 inches or more). However, it is also possible to manufacture the combined substrate having a smaller diameter than 100 mm. Further, a manner of the cutting layout of the materials of the seed crystal substrates is not limited to the layout shown in the abovementioned embodiment. Each one of the seed crystal substrates may be manufactured from the substrate having a diameter of 2 inches or less. In addition, the combined substrate having an outer shape other than the disc shape can also be manufactured.

EXAMPLE

Example

Figure 5:
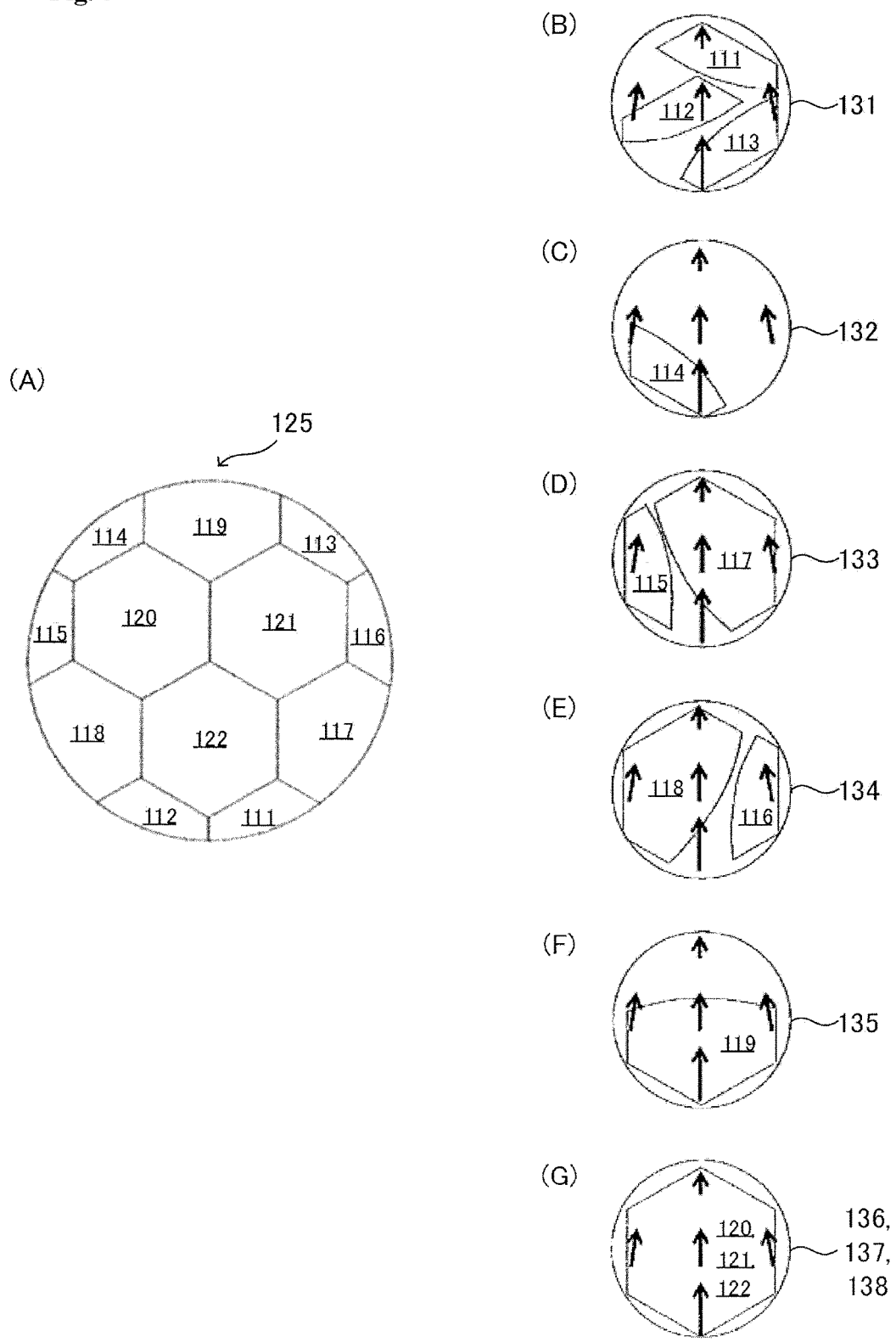
FIG. 5(A) is a layout view showing the layout of the seed crystal substrates in the seed crystal substrate assembly.
FIG. 5(B) to FIG. 5(G) are schematic plan views showing the material substrate and the cutting layout pattern of the seed crystal substrates according to an example.

Eight commercially available GaN (0001) substrates having a diameter of 2 inches and a thickness of 400 μm were prepared as material substrates. FIG. 5(A) is a layout view showing the layout of twelve seed crystal substrates 111 to 122 assembled into a disc shape having a diameter of 110 mm, and FIG. 5(B) to FIG. 5(G) are schematic plan views showing the cutting layout pattern (drawing pattern) of the material substrates 111 to 122 defined in eight material substrates 131 to 138. Each one of the seed crystal substrates 111 to 122 has a shape surrounded by the sides which are all perpendicular to <10-10> direction, other than the arc portion that defines the outer periphery of the disc-shaped seed crystal substrate assembly 125.

Similarly to the explanation for the abovementioned embodiment, FIG. 5(A) showing the seed crystal substrate assembly 125 shows the main surface side, and FIG. 5(B) to FIG. 5(G) showing the material substrates 131 to 138 show the opposite side of the main surface, wherein the shapes of the seed crystal substrates 111 to 122 are inverted in FIG. 5(A), and FIG. 5(B) to FIG. 5(G). Further, the arrows in FIG. 5(B) to FIG. 5(G) indicate an image of the off-angle distribution, similarly to the explanation for FIG. 1(B) to FIG. 1(E).

By laser scribing that performs laser irradiation (drawing) to the material substrates 131 to 138 from the opposite side surface of the main surface, the seed crystal substrates 111 to 122 were obtained. More specifically, the following processing was performed. A laser beam with a wavelength of 532 nm and an output of 5 W was used. When the drawing pattern was overwritten five times at a feeding speed of 2 mm/s, a groove with a depth of 350 μm was dug. The seed crystal substrates 111 to 122 with the shape defined by this patterning, were cut out by cleavage, and were made to be separated from the material substrates 131 to 138. Then, in order to remove cutting powder generated with cutting, the seed crystal substrates were washed by a mixed solution of 1:1 hydrochloric acid and hydrogen peroxide, and dried by $N_2$ blowing after washing.

Next, the seed crystal substrates 111 to 122 were arranged on the disc-shaped base material made of pyrolytic graphite having a diameter of 110 mm, with seed crystals closely disposed to each other allowing no gaps generated between them as much as possible with (0001) planes faced upward in a layout as shown in FIG. 5(A) using Aron Ceramic C agent, to thereby form the seed crystal substrate assembly 125. At this time, directions of the inclinations of the off-angle, are aligned in one direction. By arranging the seed crystal substrates 111 to 122 cut out in the pattern as shown in FIG. 5(B) to FIG. 5(G) in the layout as shown in FIG. 5(A), off-directions could be uniform. The adhesive agent was naturally dried for 24 hours, and thereafter dried for 1 hour at 90° C., and dried for 1 hour at 150° C., and solidified. Here, when the gap between parts was observed by an optical microscope, it was confirmed that the gap at a widest place was 42 μm.

Thereafter, the base material with the seed crystal substrate assembly 125 formed thereon, was introduced to the HVPE apparatus. The temperature was raised to 1070° C., while supplying $NH_3$ gas for the purpose of preventing the decomposition of the seed crystal. Thereafter, a supply partial pressure of the GaCl gas was set to 3.2 kPa, and a supply partial pressure of the $NH_3$ gas was set to 13 kPa, to cause the crystal growth in $H_2/N_2$ atmosphere. At this time, $H_2$ composition was set to 20%. After growth for 5 hours, a homo-epitaxial layer with a thickness of 1.2 mm was formed, and further homo-epitaxial layers grown from the adjacent seed crystals were completely combined, to thereby obtain a GaN crystal with a diameter of 110 mm.

The outermost surface layer became a sacrificial layer, and freestanding of the crystal after growth was easily carried out from the pyrolytic graphite of the base material. Although the adhesive agent was fixed to the back surface of the freestanding crystal, such a component can be completely removed when the crystal was dipped in an aqueous solution containing HF 20% for 2 hours.

Thereafter, periphery processing and front and back polishing were applied to the freestanding crystal. As described above, the group III nitride substrate having a large diameter of 100 mm was obtained. It was confirmed that there was no through holes over the entire surface visually or using an optical microscope. The plane orientation distribution of the main surface was evaluated by an X-ray diffraction method at a pitch of 5 mm in <10-10 direction> and <11-20> direction. As a result, it was found that the difference between the maximum value and the minimum value of the off-angle was 0.2°.

Comparative Example 1

A comparative example 1 is different from the example in the point that the seed crystal substrates were arranged on the base material without using the adhesive agent, and fixed thereon with an alumina jig from an outer periphery. Then, a growth into combined state by homo-epitaxial growth was attempted. As a result, the crystal grown on each seed crystal substrate was combined into a mosaic, and was not combined in the same plane. Further, incomplete assembly parts were scattered, and a plurality of through holes were generated. In addition, fixation was generated between polycrystalline GaN generated on the alumina jig, and crystalline GaN that initiated growth from the seed crystal substrates, thus generating high-density cracks on the outer peripheral portion. Processing thereafter could not be applied to the crystal of comparative example 1 thus obtained.

Comparative Example 2

Comparative example 2 is different from the example in the point that the seed crystal substrates were simply arranged on a susceptor of a crystal growth apparatus without using the adhesive agent, and the growth into combined state by homoepitaxial growth was attempted. Although there are luckily combined crystals, a majority is an incomplete assembly due to a rotation in the plane (through holes were also generated), or crystals not combined to each other due to excessively widening of the gap. Accordingly, a circular large-diameter crystal could not be obtained.

As described above, the present invention has been described based on the embodiments and the examples. However, the present invention is not limited thereto, and for example it is obvious for a skilled person that various modifications, improvements, and combinations, etc., can be acceptable.

DESCRIPTION OF SIGNS AND NUMERALS 10 to 17, 111 to 122 Seed crystal substrate
20, 125 Seed crystal substrate assembly
30-34, 131 to 138 Material substrate
40 Laser beam
50, 51 Base material
52 Groove, recess portion (on the base material)
60 Adhesive agent
70 Group III nitride single crystal layer
80 Group III nitride crystal portion
90 Group III nitride combined substrate
100 Side surface (of the seed crystal substrate)
101 Cleavage plane ({10-10} plane)

The invention claimed is:

1. A method for manufacturing a group III nitride substrate, comprising:
    preparing a plurality of seed crystal substrates formed into shapes that can be arranged with side surfaces opposed to each other;
    arranging the plurality of seed crystal substrates on a base material in an appearance that the seed crystal substrates are arranged with the side surfaces of the adjacent seed crystal substrates opposed to each other, wherein, in arranging the plurality of seed crystal substrates on the base material, the plurality of seed crystal substrates are arranged on the base material by being adhered on the base material by an adhesive agent, the base material having a recess portion, formed on the base material between the seed crystal substrates arranged adjacent to each other before the adhesive agent is applied, for flowing excess adhesive agent thereinto; and
    growing a group III nitride crystal above main surfaces of the plurality of seed crystal substrates, so that crystals grown on each main surface are integrally combined with each other.

2. The method for manufacturing a group III nitride substrate according to claim 1, wherein a material with a linear expansion coefficient in a direction parallel to the main surface, being equivalent to or smaller than those of the seed crystal substrate and the group III nitride crystal, is selected as a material of the base material.

3. The method for manufacturing a group III nitride substrate according to claim 1, wherein the seed crystal substrate and the group III nitride crystal are formed by a group III nitride represented by a general formula $Al_xIn_yGa_{1-x-y}N$ ($0 \leq x \leq 1, 0 \leq y \leq 1, 0 \leq x+y \leq 1$).

4. The method for manufacturing a group III nitride substrate according to claim 1, wherein the main surfaces of the plurality of seed crystal substrates are formed as (0001) planes or (000-1) planes, and the mutually opposed side surfaces of the plurality of seed crystal substrates are all formed so that {10-10} planes are exposed.

5. The method for manufacturing a group III nitride substrate according to claim 1, wherein in preparing the plurality of seed crystal substrates, a plurality of the material substrates are prepared, and the plurality of seed crystal substrates are separated from the plurality of the material substrates.

6. The method for manufacturing a group III nitride substrate according to claim 1, wherein in arranging the plurality of seed crystal substrates on the base material, the side surfaces are made to be close to each other, with a gap of 100 μm or less at largest between them.

7. The method for manufacturing a group III nitride substrate according to claim 1, wherein
    in preparing the plurality of seed crystal substrates, the plurality of seed crystal substrates are prepared so that a difference between a maximum value and a minimum value of an off-angle of each one of the plurality of seed crystal substrates is 0.5° or less at largest, and
    in arranging the plurality of seed crystal substrates on the base material, the plurality of seed crystal substrates are arranged, so that an angle formed by directions of inclinations of the off-angle is 10° or less in planes of the plurality of seed crystal substrates arranged on the base material.

8. The method for manufacturing a group III nitride substrate according to claim 1, wherein in arranging the plurality of seed crystal substrates on the base material, the plurality of seed crystal substrates are arranged to be combined in a disk shape, and include a hexagonal seed crystal substrate arranged inside a circular arc portion of the disk shape and a seed crystal substrate defining the circular arc portion of the disk shape.

9. The method for manufacturing a group III nitride substrate according to claim 1, wherein
    in arranging the plurality of seed crystal substrates on the base material, the adhesive agent is dried and solidified after arranging the plurality of seed crystal substrates on the base material by adhering on the base material by the adhesive agent, and
    in growing the group III nitride substrate, the base material on which the plurality of seed crystal substrates are arranged by the adhesive agent is introduced into a crystal growth device, and the group III nitride crystal is grown, after drying and solidifying the adhesive agent.

10. The method for manufacturing a group III nitride substrate according to claim 9, wherein the adhesive agent is an adhesive agent which solidifies at a temperature lower than a growth temperature of the group III nitride crystal, and withstand the growth temperature and a growth atmosphere of the group III nitride crystal.

11. The method for manufacturing a group III nitride substrate according to claim 1, wherein the adhesive agent is an adhesive agent having a linear expansion coefficient equal to a linear expansion coefficient of the group III nitride crystal.

12. The method for manufacturing a group III nitride substrate according to claim 1, wherein the adhesive agent is an adhesive agent having at least one of zirconia or silica as a main component.

13. The method for manufacturing a group III nitride substrate according to claim 1, further comprising:
   separating a laminated portion of the plurality of seed crystal substrates and the group III nitride crystal from the base material, after growing the group III nitride crystal,
   wherein the base material is a base material whose outermost surface layer becomes a sacrifice layer, when the laminated portion is separated.

14. The method for manufacturing a group III nitride substrate according to claim 13, wherein the base material is the material made of pyrolytic graphite.

15. The method for manufacturing a group III nitride substrate according to claim 1, wherein the preparing the plurality of seed crystal substrates further comprises cleaning the seed crystal substrate separated in separating the seed crystal substrate.

\* \* \* \* \*